(12) United States Patent
Shimamoto et al.

(10) Patent No.: US 6,683,260 B2
(45) Date of Patent: Jan. 27, 2004

(54) MULTILAYER WIRING BOARD EMBEDDED WITH TRANSMISSION LINE CONDUCTOR

(75) Inventors: Takeshi Shimamoto, Osaka (JP); Kazufumi Yamaguchi, Osaka (JP); Masahide Tsukamoto, Nara (JP); Fumikazu Tateishii, Osaka (JP); Yutaka Taguchi, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 63 days.

(21) Appl. No.: 09/897,127

(22) Filed: Jul. 3, 2001

(65) Prior Publication Data

US 2002/0017963 A1 Feb. 14, 2002

(30) Foreign Application Priority Data

Jul. 4, 2000 (JP) .................................... 2000-201875

(51) Int. Cl.[7] ............................................... H05K 1/00
(52) U.S. Cl. ........................ 174/268; 29/830; 174/261
(58) Field of Search .................... 174/268, 36, 261; 361/777, 794, 793, 780; 29/830

(56) References Cited

U.S. PATENT DOCUMENTS

| | | | |
|---|---|---|---|
| 4,816,616 A | * | 3/1989 | Jones |
| 5,281,769 A | | 1/1994 | Hirano et al. |
| 6,040,524 A | * | 3/2000 | Kobayashi et al. |
| 6,233,819 B1 | * | 5/2001 | Tsubakida et al. |
| 6,326,556 B1 | * | 12/2001 | Asai et al. |

FOREIGN PATENT DOCUMENTS

| | | |
|---|---|---|
| JP | 5-22004 | 1/1993 |
| JP | 5-63373 | 3/1993 |
| JP | 6-209151 | 7/1994 |
| JP | 7-135407 | 5/1995 |
| JP | 8-32244 | 2/1996 |
| JP | 8-321706 | 12/1996 |
| JP | 9-93005 | 4/1997 |

OTHER PUBLICATIONS

English Language Abstract of JP 5–22004.
English Language Abstract of JP 9–93005.
English Language Abstract of JP 8–321706.
English Language Abstract of JP 6–209151, Jul. 26, 1994.
English Language Abstract of JP 5–63373, Mar. 12, 1993.
English Language Abstract of JP 7–135407, May 23, 1995.
English Language Abstract of JP 8–32244, Feb. 2, 1996.
Nishikawa, et al., "U–Shaped MMIC Coplanar Waveguides", 1992.

* cited by examiner

*Primary Examiner*—David L. Talbott
*Assistant Examiner*—Jeremy Norris
(74) *Attorney, Agent, or Firm*—Greenblum & Bernstein, P.L.C.

(57) ABSTRACT

Transmission line structure is composed of a pair of signal conductors which are embedded in one wiring region of a dielectric layer and a thickness in height of the signal conductor is larger than a width, and is constituted so that a coupling impedance between the adjacent signal conductors is lower than a coupling impedance between the signal conductor and another conductor formed in another wiring region, and thus to provide a multi-layer wiring board having a transmission line structure of high wiring density and excellent transmission characteristic.

11 Claims, 6 Drawing Sheets

MULTILAYER WIRING BOARD EMBEDDED WITH TRANSMISSION LINE CONDUCTOR

BACKGROUND OF THE INVENTION

1. Field of the Invention

The present invention generally relates to a multilayer wiring board having a transmission line structure of high wiring density, and in particular to a conductor-embedded type of a multi-layer wiring board having transmission line structure composed of at least a pair of adjacent signal conductors embedded near a surface of a dielectric layer and also relates to a manufacturing method thereof.

2. Description of the Prior Art

FIG. 8 shows a wiring pattern model of a conventional multi-layer wiring board or multi-chip waveguide generally used in information equipment and the like. In this construction, a characteristic impedance representing a signal transmission characteristic of line conductors or wires for connecting semiconductor components and the like elements is defined as $Z_0=\sqrt{L/C}$ where C is a capacity and L is an inductance per a unit length of the line conductor or wire. In this definition, the capacity C and inductance L are determined by, e.g., a width and thickness of the conductor of the wiring pattern and a thickness of an insulating layer region, and therefore the characteristic impedance $Z_0$ is also determined by these factors.

In designing a wiring structure, the value of the characteristic impedance $Z_0$ is determined in consideration of a higher-speed processing, circuit system, crosstalk value and the like of semiconductor components, and the value of the characteristic impedance of the wiring structure for use in information equipment is generally in a range of several tens Ω to one hundred Ω. Unification or equality of characteristic impedance values is also especially important in view of reducing noises. If there exists a discontinuous point in a wiring structure, a reflection occurs to cause an erroneous operation in the information equipment.

The following explains a typical example of a transmission waveguide structure of a printed wiring board having an insulation region composed of a dielectric layer. FIG. 9 shows a cross section of a basic form of a microstrip waveguide, where a strip signal conductor 3 is formed on one surface (upper surface in the drawing) of the dielectric body (i.e., board or layer) 1 and a flat plane conductor 2 such as a grounding conductor layer is formed on the other surface (bottom surface in the drawing) of the dielectric board 1 so as to generate an electric field (electric power lines) across the center portion and edge portion of the dielectric body as shown by dotted lines in the drawing.

The thickness of the dielectric board 1 is T and a signal conductor 3 having a width w and thickness (i.e., height) t is formed on the upper surface thereof in the drawing. For example, approximate values thereof are used as such that, the thickness T is 220 μm, width w is 360 μm and thickness t is at least 10 μm. Thus, the characteristic impedance of the signal conductor 3 with respect to the lower plane conductor 2 is approximately determined by a dielectric constant ∈ of the dielectric material and thickness T of the dielectric board 1 and the width w of the signal conductor 3 disregarding the thickness t of the signal conductor 3 because the thickness t of the signal conductor 3 is enough small with respect to the width w (i.e., t<<w). Therefore, difference or unevenness in characteristic impedances is caused due to differences in width w and thickness T, and because of the small thickness t of the signal conductor 3, there arises a problem that a loss increases in electric consumption as a resistance of the signal conductor increases when constructing a wiring pattern with high wiring density.

FIG. 10 shows a wiring board having a plurality of line conductors 3a through 3e. Assuming that each gap distance between adjacent two conductors is substantially equal to the width of each signal conductor 3, three usage examples thereof will be explained as below.

In the first example, the respective conductors are used as independent five signal conductors. In the case of a wiring structure having a characteristic impedance of around 50 Ω which is normally used, a coupling impedance (also regarded as a coupling capacity) between the adjacent signal conductors is fairly higher in dimension than the coupling impedance between the signal conductors and the plane conductor 2. However, a cross-talk between the adjacent signal conductors becomes a problem.

In the second example, a shielding conductor is placed between signal conductors in order to reduce a cross-talk. For example, the line conductors 3b and 3d are used as signal conductors, and the line conductors 3a, 3c and 3e are used as the shielding conductors having the same potential as that of the plane conductor 2. Generally, in order to lower the cross-talk, in comparison with the case where gaps between the signals conductors are increased, the provision of the shielding conductors makes the wiring density of the transmission line structure to be higher.

In the third example, the adjacent two line conductors 3b and 3c are used as a pair of balanced transmission line conductors, and the line conductors 3a and 3d positioned at both sides thereof are used as the shielding conductors.

FIG. 11 shows another example of a conventional microstrip waveguide structure in which the dielectric region 1 and plane conductors 2 are provided over both upper and lower surfaces of the signal conductor 3. In this structure, in the case where the microstrip waveguide is incorporated in a multi-layer wiring board, interference with other wiring layers can be reduced, and excellent transmission characteristics can be obtained.

FIG. 12 shows an example of a conventional coplanar transmission waveguide structure, where a signal conductor 3 and a pair of plane conductors 4 are provided on the same surface of the dielectric board 1. This coplanar type can be composed of one wiring layer, but high density of the transmission lines cannot be obtained, and the coplanar type is easily influenced by surroundings or conductors on another layer. For this reason, this coplanar transmission waveguide structure is not suitable to be incorporated into a multi-layer wiring board.

The aforementioned conventional transmission waveguides are manufactured in such a manner that a signal wiring pattern is formed by photolithographing and etching a thin copper foil which is stuck to the dielectric board 1. Also, in a conventional planar type of a transmission waveguide structure, it is difficult to make an aspect ratio of each line conductor larger than 1 even by any method of a plating, printing or etching.

As a signal processing ability such as a microprocessor has been improved by a high-integrating technique of semiconductor IC year by year, a wiring board provided with such a microprocessor requires a severe condition for improvement of wiring density and transmission characteristics as following.

The first problem is to improve a wiring density. When a number of connection terminals of a semiconductor chip and a package is increased, a higher wiring density on the wiring board is required. The wiring density for one wiring board can be improved by multilayering, but the multilayering causes a high cost due to an increase in a number of layers and an increase in an area for via wiring. For this reason, the improvement in the wiring density for one layer is essentially required.

The second problem is to improve transmission characteristics of a transmission waveguide structure. A signal bus construction is particularly important in wiring, and an influence of a noise such as a reflection and a cross-talk becomes large due to a higher speed of a signal rate. Therefore, improvement of a wiring structure is required, reducing unevenness in characteristic impedance of the transmission line conductors when manufacturing the wiring board together with lowering a cross-talk.

In order to increase a wiring density of transmission lines while maintaining a characteristic impedance value constant, the thickness (T) of the dielectric board and the width (w) of the signal conductor should be reduced proportionally. In order to maintain a manufacturing accuracy of a width of a signal conductor by etching, the thickness (t) thereof must be also reduced proportionally. In general, as they are reduced, the control of unevenness in manufacturing becomes more difficult. Moreover, since a cross section of the signal conductor is reduced by the second power of a reducing ratio, there arises a problem of deterioration in transmission characteristics due to increase of a resistance value. In the conventional structure of the transmission waveguide, it is difficult to satisfy the requirement of the first and second problems simultaneously.

SUMMARY OF THE INVENTION

It is an object of the present invention to provide a multilayer wiring board having a transmission line structure which enables improvement of a wiring density and a transmission characteristic and to provide a manufacturing method thereof.

In order to solve this problem, a multi-layer wiring board has transmission line structure comprised of at least a pair of adjacent signal conductors which are embedded in a first region near one surface of a dielectric layer, wherein a thickness in height of each of the signal conductors is larger than a width thereof, and the thickness of each of the signal conductors is larger than a gap distance between the adjacent signal conductors.

In this construction, a coupling impedance between the adjacent two signal conductors is lower than a coupling impedance between each of the signal conductors and a conductor formed in a second region near the opposite surface of the dielectric layer.

Moreover, a manufacturing method of a multi-layer wiring board comprises the steps of: providing a conductor in a first region near one surface of a dielectric layer to form transmission lines comprised of at least a pair of adjacent signal conductors which are embedded in the first region; and defining a configuration of the signal conductors so that a thickness in height of each of the signal conductors is larger than a width thereof, and the thickness of each of the signal conductors is larger than a gap distance between the adjacent signal conductors.

In this method, a groove is formed for embedding the conductor in the dielectric layer by molding die for forming the transmission lines.

By this arrangement, the transmission line conductors are embedded in the dielectric layer and each line conductor has an aspect ratio being larger than 1. In this construction, a pitch between the transmission lines is small, and the wiring density is made high, and further exhibiting small wiring resistance considering the width of the signal conductor and favorable matching properties of characteristics impedance of the transmission lines. It is thus possible to achieve both, high density wiring as well as high-speed and excellent transmission characteristics.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:.

DETAILED DESCRIPTION OF THE PREFERRED EMBODIMENT

Figure 1A:
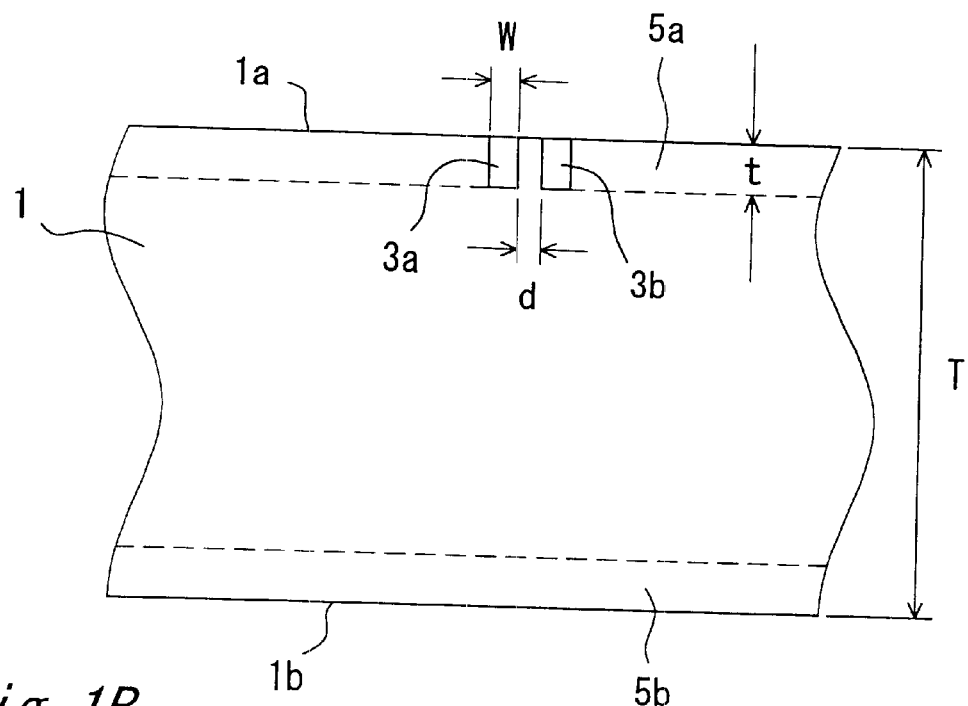
FIGS. 1A, 1B and 1C are diagrams showing a structure of a transmission waveguide according to one embodiment of the present invention.

A first aspect of the present invention provides a multi-layer wiring board having a transmission line structure comprised of at least a pair of adjacent signal conductors which are embedded in a first region near one surface of a dielectric layer, wherein a thickness in height of each of the signal conductors is larger than a width thereof, and the thickness of each of the signal conductors is larger than a gap distance between the adjacent signal conductors.

In this construction, a coupling impedance between the adjacent two signal conductors is lower than a coupling impedance between each of the signal conductors and a conductor formed in a second region near the opposite surface of the dielectric layer. Moreover, a thickness of the dielectric layer may be at least ten times larger than the gap distance between the adjacent signal conductors.

A second aspect of the present invention provides a multi-layer wiring board having a dielectric layer which includes a first wiring region defined by a predetermined depth from one surface of the dielectric layer and a second wiring region defined by a predetermined depth from the opposite surface of the dielectric layer, wherein transmission lines composed of at least a pair of adjacent signal conductors are embedded in the first wiring region, wherein a thickness in height of each of the signal conductors is larger than a width thereof, and wherein a coupling impedance between the adjacent two signal conductors is lower than a coupling impedance between each of the signal conductors and a conductor formed in the second wiring region of the dielectric layer.

In this construction, the thickness of each signal conductor is in a range from at least one time to five times of the width thereof, and a thickness of the dielectric layer is at least ten times larger than the width of the signal conductor. Moreover, shielding conductors may be provided on both sides of the pair of the signal conductors in the first wiring region.

A third aspect of the present invention provides a manufacturing method of a multi-layer wiring board comprising the steps of: providing a conductor in a first region near one surface of a dielectric layer to form a transmission line structure comprised of at least a pair of adjacent signal conductors which are embedded in the first region; and defining a configuration of the signal conductors so that a thickness in height of each of the signal conductors is larger than a width thereof, and the thickness of each of the signal conductors is larger than a gap distance between the adjacent signal conductors.

In this method, a coupling impedance between the adjacent two signal conductors is made lower than a coupling impedance between each of the signal conductors and a conductor formed in a second region near the opposite surface of the dielectric layer.

Moreover, a thickness of the dielectric layer may be made at least ten times larger than the gap distance between the adjacent signal conductors. Further, a groove may be formed for embedding the conductor in the dielectric layer by molding die for forming the transmission lines. Furthermore, solder may be poured into a metallic layer adhered to an inner wall of the groove to form the conductor for forming the transmission lines.

The following explains preferred embodiments of the present invention with reference to FIGS. 1 through 7.

Embodiment 1

FIG. 1A shows a cross section of a two-layered wiring board which is a basic structure of a multi-layer wiring board for multi-chip connection according to the present invention. In FIG. 1A, the two-layered wiring board includes a dielectric layer region (also referred to as "substrate" hereinafter) 1, a first wiring region 5a and second wiring region 5b which are layer-like wiring regions in the present embodiment. The first wiring region 5a and second wiring region 5b are respectively provided inside the first (i.e., upper) surface 1a and second (i.e., lower) surface 1b of the dielectric layer 1 which is made of a dielectric material such as polyimide. The first wiring region 5a is defined in thickness by a predetermined depth (t) from one surface (i.e., upper surface 1a in the drawing) of the dielectric layer 1 and the second wiring region 5b is defined in thickness by a depth from the other surface (i.e., lower surface 1b in the drawing). This indicates that the wiring density of the transmission line can be also increased by a multi-layer construction thereof.

A pair of adjacent signal conductors, i.e., first and second signal conductors 3a and 3b are embedded within the first wiring region 5a of the dielectric substrate 1 to provide a transmission line structure 3 of an embedded form. Each of the signal conductors 3a and 3b is configured to have a thickness t in height (which is substantially equal to the depth of the first wiring region 5a) and a width w, and a gap distance d therebetween which is substantially equal to the width w.

It is noted here that the gap distance d is not limited to be equal to the width w so long as the gap d is by far smaller than the thickness T of the dielectric substrate 1. Thus, the present embodiment is characterized in that the thickness t of the signal conductor is larger than the width w (w<t), and the thickness t of the signal conductor is by far smaller than the thickness T of the dielectric substrate 1 (t<<T), in comparison with the conventional structure (t<<w, and w>T) as described before.

In a preferred embodiment, the thickness t of the signal conductor is defined in a range from at least one time to five times of the width w. In specific, in the case where the thickness T of the dielectric substrate 1 is, for example, 200 $\mu$m, the width w of the signal conductor may be in a range of 15 to 20 $\mu$m and the thickness t is in a range of 30 to 60 $\mu$m.

As a dielectric material other than polyimide, a resin impregnated sheet or resin impregnated fiber sheet comprised of one or more types of resin selected from glass epoxy composite, glass BT resin composite, epoxy resin and aramid epoxy resin may be used. Also, a copper foil or nickel foil may be used as a material of the wiring conductor, and a green sheet of an inorganic material such as low melting glass or low melting alumina and the like may be used as a dielectric film.

Figure 1B:
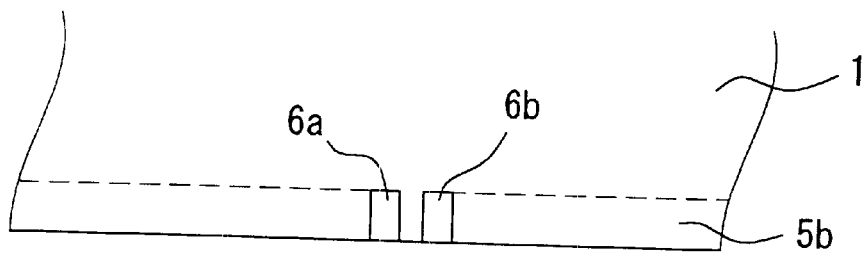
Figure 1C:
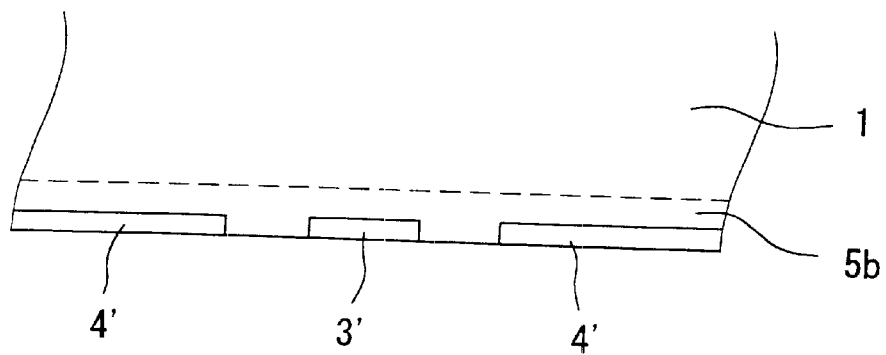
Figure 2:
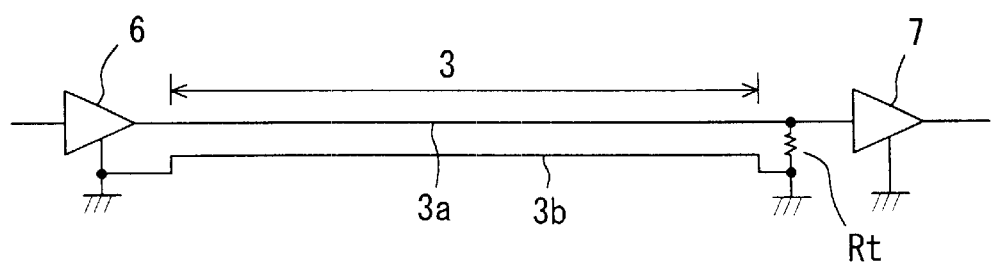
FIG. 2 is a diagram showing a structure of the transmission waveguide according to one embodiment of the present invention.
Figure 3:
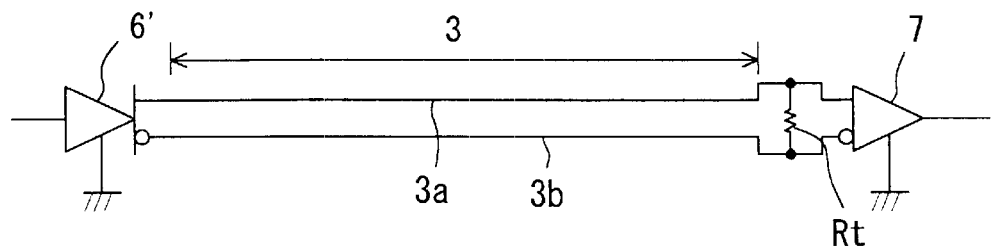
FIG. 3 is a diagram showing a structure of the transmission waveguide according to one embodiment of the present invention.

FIGS. 2 and 3 show usage examples of the transmission line structure 3 shown in FIG. 1. In FIG. 2, the first signal conductor 3a of the transmission line structure 3 is connected between an unbalanced type driver 6 and a receiver 7, and in the receiver 7 side, the second signal conductor 3b is connected in common to a terminating resistor Rt of a characteristic impedance of the transmission line structure 3 and a reference potential such as a grounding.

Similarly, FIG. 3 shows a usage example as a balanced type (or differential type) of a transmission waveguide where a terminating resistor Rt is interposed across the first and second signal conductors 3a and 3b in the receiver 7 side. In this arrangement, the second signal conductor 3b is inversely connected between the driver 6 and the receiver 7.

Figure 8:
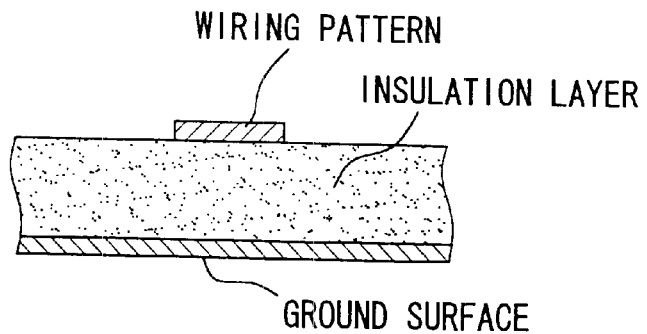
FIG. 8 is a diagram showing a structure of a conventional transmission waveguide.

The transmission waveguide structure explained with reference to FIG. 1A is dimensionally and completely different from the conventional transmission waveguide structure explained with reference to FIGS. 8 to 10. That is, the conventional transmission waveguide has a low coupling impedance (coupling capacity) between the signal conductor 3 and the plane conductor 2, and the characteristic impedance is determined by this relationship of the width and thickness of the conductors of the wiring pattern, thickness of the dielectric substrate and the like.

In contrast, in the transmission waveguide structure of the present invention, even if the second wiring region 5b is formed of a plane conductor, the coupling impedance (coupling capacitor) between the first and second signal conductors 3a and 3b can be made enough smaller than the coupling impedance (coupling capacitor) between the respective signal conductors 3 and the plane conductor in the second wiring region 5b. For this reason, the characteristic impedance is approximately determined only by a dielectric constant of the dielectric layer (substrate) 1 and an arrangement configuration such as width and thickness of the respective signal conductors 3a and 3b.

Figure 9:
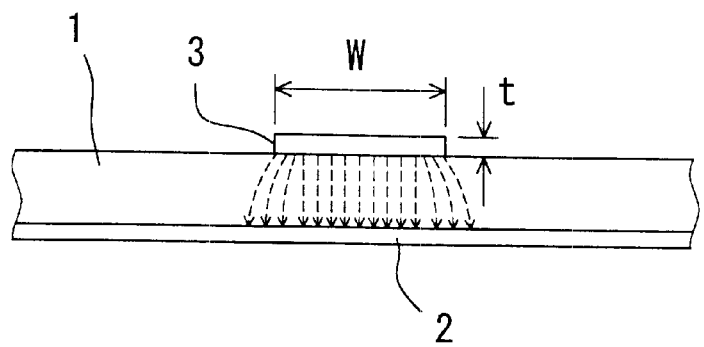
FIG. 9 is a diagram showing a structure of the conventional transmission waveguide.
Figure 10:
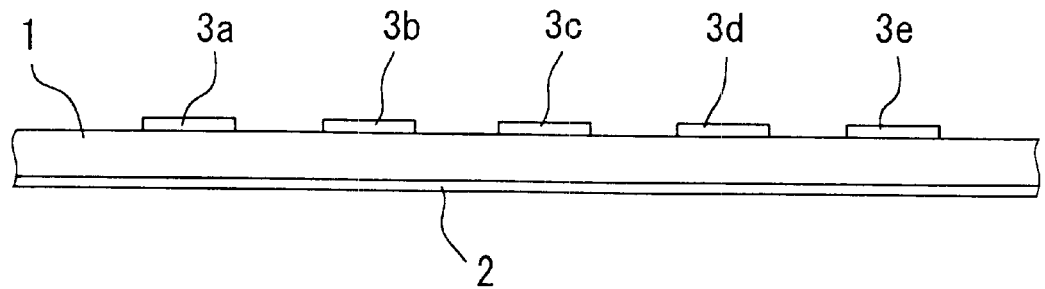
FIG. 10 is a diagram showing a structure of another conventional transmission waveguide.
Figure 11:
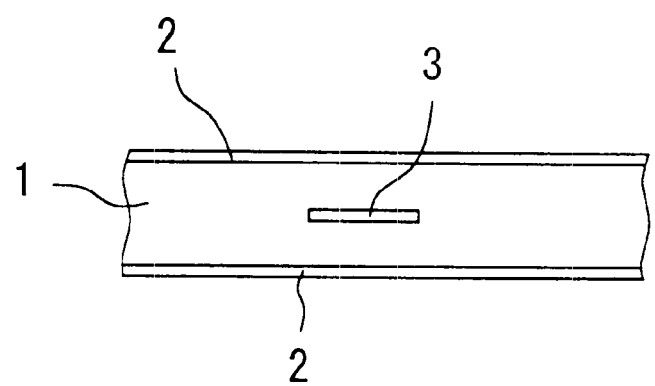
FIG. 11 is a diagram showing a structure of further another conventional transmission waveguide.
Figure 12:
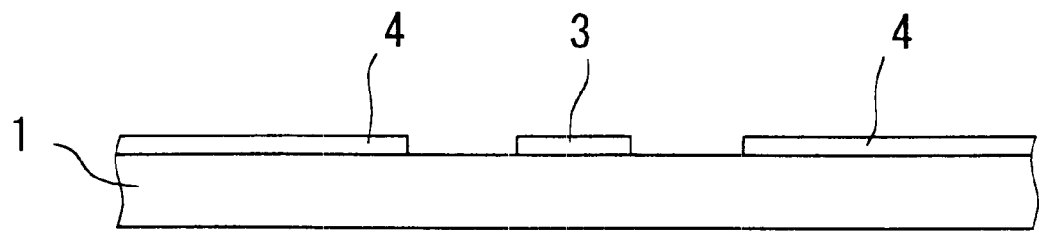
FIG. 12 is a diagram showing a structure of further another conventional transmission waveguide.

Therefore, the transmission line structure of the present invention does not require the plane conductor 2 of the second wiring region 5b as shown in FIGS. 9 and 10, and the transmission lines can be formed in a single layer of the first wiring layer 5a, that is, the second wiring region 5b can be used for another object.

Thus, although the second wiring region 5b is shown as a plane conductor in FIG. 1, it is not limited to this, and another pair of signal conductors 6a and 6b may be provided in the second wiring region 5b as shown in FIG. 1B.

Further, another type waveguide having a signal conductor 3' or other conductors 4' may be provided in the second wiring region 5b as shown in FIG. 1C. Thus, various other types of conductors may be also provided or any conductor may not be provided in the second wiring region 5b. Therefore, the conductors in the second wiring region 5b can be incorporated into another multi-layer wiring board. For this reason, this produces an effect that the wiring density of the wiring pattern can be improved.

It is noted here that, although not shown in the drawings, it is possible to further improve reliability of the transmission line characteristics by forming a thin insulating and protecting film on both or either one of the upper and lower surfaces of a wiring board of the present invention. Moreover, although the respective transmission line conductors of the wiring board are formed as straight-linear shapes in the drawings, it is also possible to arrange the transmission line conductors in a bent manner as in a flexible wiring board, if required, when using metallic foils and resin for forming the dielectric films.

Embodiment 2

Figure 4:
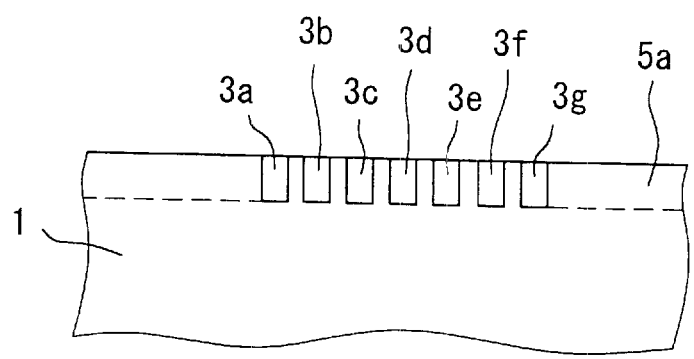
FIG. 4 is a diagram showing a structure of the transmission waveguide according to another embodiment of the present invention.

FIG. 4 shows a second embodiment of the present invention where a plurality of balanced type transmission line conductors are provided in the first wiring region 5a. In FIG. 4, a plurality of signal conductors 3a through 3g are embedded within the first wiring region 5a in one dielectric layer 1 of a multilayer wiring board. The shapes and embedded arrangement of these signal conductors 3a through 3g are similar to those of the first embodiment, and the explanation thereof is omitted here for the brevity.

Figure 5:
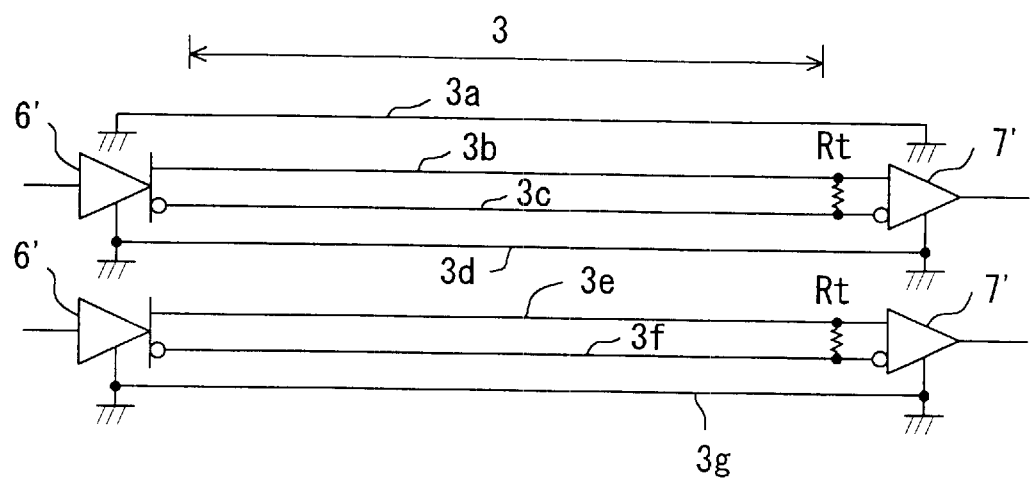
FIG. 5 is a diagram showing a structure of the transmission waveguide according to another embodiment of the present invention.

FIG. 5 shows a usage example of the transmission line structure 3 of FIG. 4. In FIG. 5, the line conductors 3b and 3c and the line conductors 3e and 3f are used as respective pairs of balanced type signal conductors (see FIG. 3), but the conductors 3a, 3d and 3g on both sides of each pair of signal conductors are used as shielding conductors which are connected to common mode electric potentials of a balanced signal. Thus, by providing the shielding conductors in this manner, a cross-talk between the balanced type signal conductors can be remarkably reduced.

Embodiment 3

Since various manufacturing methods including all the steps of the multilayer wiring board are known, the description thereof is omitted here. Significant partial steps of the manufacturing method which is applied to the present invention will be explained below.

Figure 6:
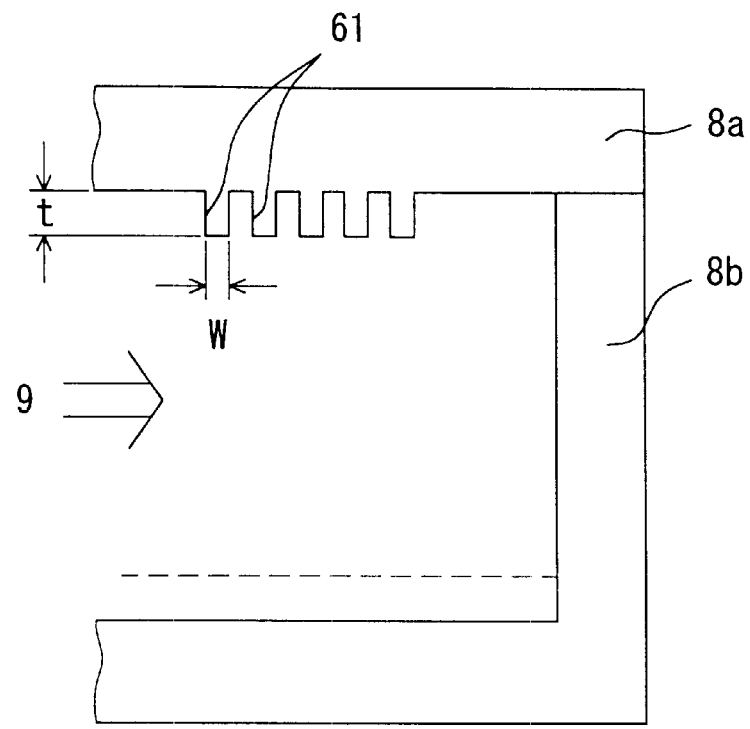
FIG. 6 is a diagram showing a method of manufacturing a transmission waveguide according to one embodiment of the present invention.

FIG. 6 shows an example of a method of manufacturing a dielectric substrate (layer) having grooves in which conductor to be transmission line structure or shielding conductor are embedded. In FIG. 6, liquid type dielectric resin 9 is injected into a space defined by a male die 8a for the grooves and a matching die 8b thereto so that a dielectric substrate having grooves is produced. Since groove forming accuracy is equivalent with conductor forming accuracy to be explained below, this accuracy is very important. However, in the method by means of the die forming, since a groove shape is determined by the accuracy of the dies, unevenness of the groove shapes in manufacturing hardly occurs in comparison with the conventional method in which a shape of the conductor is determined by etching.

In addition, when semiconductor processing is utilized, a conductor having a very fine shape can be manufactured by the dies. There was the conventional problem that a transmission characteristic is deteriorated due to an increase in the resistance value in the case of reduction of the width and thickness of a signal conductor. However, according to the present invention, in the case where the width w of the signal conductor is set to the same as that in the conventional structure, the thickness of the signal conductor can be maintained to be very larger in the present invention than conventional. For this reason, the present invention is very advantageous to the problem of the resistance value.

Therefore, by applying this manufacturing method to the present invention, the transmission waveguide can be obtained with the wiring density being very high and obtaining excellent transmission characteristics.

Figure 7:
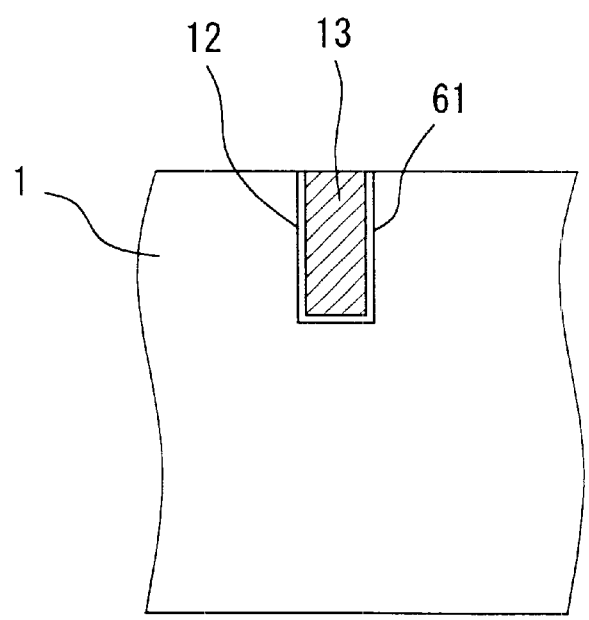
FIG. 7 is a diagram showing a method of manufacturing the transmission waveguide according to one embodiment of the present invention.

FIG. 7 shows an example of a method of embedding the conductor in the groove of the dielectric substrate. As for the method of embedding the conductor in the groove, a plating method is very popular, but this has a disadvantage that it requires a lot of time to deposit metal.

The method shown in FIG. 7 is for allowing a copper-made thin sheath layer 12 to adhere to an inner wall of a groove 61 for embedding a conductor for wiring in the dielectric substrate 1 using an electroless plating method. Then, by pouring molten solder into the groove having the inner wall coated with the copper sheath layer, the line conductor for wiring is formed. According to this method, the manufacturing time can be shortened greatly in comparison with the method of forming a whole conductor according to plating.

As described above, according to the present invention, the transmission line conductors are embedded in the dielectric substance and each line conductor has an aspect ratio being larger than 1. In this construction, a pitch between the transmission lines is small, and the wiring density is made high, and further exhibiting small wiring resistance considering the width of the signal conductor and favorable matching properties of characteristics impedance of the transmission lines. It is thus possible to achieve both, high density wiring as well as high-speed and excellent transmission characteristics, and thus remarkable effects can be obtained in view of industrial applicability.

The present disclosure relates to subject matter contained in priority Japanese Patent Application No. 2000-201875, filed on Jul. 4, 2000, the contents of which is herein expressly incorporated by reference in its entirety.

What is claimed is:

1. A multi-layer wiring board having a transmission line structure comprising at least a pair of adjacent signal conductors which are embedded in a first region near one surface of a dielectric layer, wherein a thickness in height of each of the signal conductors is larger than a width thereof, the thickness in height of each of the signal conductors is larger than a gap distance between the adjacent signal conductors, and a thickness in height of the dielectric layer is at least three times larger than the thickness in height of each of the signal conductors.

2. The multi-layer wiring board according to claim 1, wherein a coupling impedance between the adjacent two signal conductors in the first region is lower than a coupling impedance between one of the signal conductors and a conductor formed in a second region near the opposite surface of the dielectric layer.

3. The multi-layer wiring board according to claim 1, wherein the thickness of the dielectric layer is at least ten times larger than the width of the signal conductor.

4. The multi-layer wiring board according to claim 1, wherein the thickness of the dielectric layer is at least ten times larger than the gap distance between the adjacent signal conductors.

5. A multi-layer wiring board having a dielectric layer which includes a first wiring region defined by a predetermined depth from one surface of the dielectric layer and a second wiring region defined by a predetermined depth from the opposite surface of the dielectric layer, wherein a transmission line structure comprising at least a pair of adjacent signal conductors are embedded in the first wiring region, wherein a thickness in height of each of the signal conductors is larger than a width thereof, the thickness in height of each of the signal conductors is far smaller than a thickness in height of the dielectric layer, and a coupling impedance between the two adjacent signal conductors in the first region is lower than a coupling impedance between one of the signal conductors in the first region and a conductor formed in the second wiring region of the dielectric layer.

6. The multi-layer wiring board according to claim 5, wherein the thickness in height of each signal conductor is in a range from at least one time to five times of the width thereof.

7. The multi-layer wiring board according to claim 5, wherein shielding conductors are provided on both sides of the pair of the signal conductors in the first wiring region.

8. A manufacturing method of a multi-layer wiring board, the method comprising:

providing a conductor in a first region near one surface of a dielectric layer to form a transmission line structure comprising at least a pair of adjacent signal conductors which are embedded in the first region; and defining a configuration of the signal conductors so that a thickness in height of each of the signal conductors is larger than a width thereof, the thickness of each of the signal conductors is larger than a gap distance between the adjacent signal conductors, and the thickness in height of each of the signal conductors is far smaller than a thickness in height of the dielectric layer.

9. The manufacturing method according to claim 8, wherein a coupling impedance between the adjacent two signal conductors is made lower than a coupling impedance between each of the signal conductors and a conductor formed in a second region near the opposite surface of the dielectric layer.

10. The manufacturing method according to claim 8, further comprising the step of forming a groove for embedding a conductor in the dielectric layer by a molding die for forming the transmission line structure.

11. The manufacturing method according to claim 10, further comprising the step of pouring solder into a metallic layer adhered to an inner wall of the groove to form the conductor for forming the transmission line structure.

* * * * *

UNITED STATES PATENT AND TRADEMARK OFFICE
CERTIFICATE OF CORRECTION

PATENT NO. : 6,683,260 B2
DATED : January 27, 2004
INVENTOR(S) : T. Shimamoto et al.

It is certified that error appears in the above-identified patent and that said Letters Patent is hereby corrected as shown below:

<u>Title page,</u>
Item [75], Inventors, the fourth-listed inventor "Fumikazu Tateishii" should be
-- Fumikazu Tateishi --

Signed and Sealed this

Thirteenth Day of July, 2004

JON W. DUDAS
*Acting Director of the United States Patent and Trademark Office*